US006442741B1

(12) United States Patent
Schultz

(10) Patent No.: US 6,442,741 B1
(45) Date of Patent: Aug. 27, 2002

(54) METHOD OF AUTOMATICALLY GENERATING SCHEMATIC AND WAVEFORM DIAGRAMS FOR ANALYSIS OF TIMING MARGINS AND SIGNAL SKEWS OF RELEVANT LOGIC CELLS USING INPUT SIGNAL PREDICTORS AND TRANSITION TIMES

(75) Inventor: Richard T. Schultz, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 95 days.

(21) Appl. No.: 09/680,893

(22) Filed: Oct. 6, 2000

(51) Int. Cl.[7] .......................... G06F 17/50; G06F 19/00

(52) U.S. Cl. ............................... 716/6; 703/15; 702/67; 702/73; 702/79; 702/118; 702/125

(58) Field of Search ................... 716/1–21; 703/14–16; 702/66–74, 79, 117–118, 124–126

(56) References Cited

U.S. PATENT DOCUMENTS

| | | | | | |
|---|---|---|---|---|---|
| 4,615,010 | A | * | 9/1986 | Davis et al. | 716/19 |
| 5,487,017 | A | * | 1/1996 | Prasad et al. | 716/2 |
| 5,515,292 | A | * | 5/1996 | Roy et al. | 716/2 |
| 5,617,325 | A | * | 4/1997 | Schaefer | 716/6 |
| 5,640,328 | A | * | 6/1997 | Lam | 716/8 |
| 5,856,926 | A | * | 1/1999 | Matsumoto et al. | 716/8 |
| 5,903,468 | A | * | 5/1999 | Misheloff et al. | 703/16 |
| 5,940,779 | A | * | 8/1999 | Gaitonde et al. | 702/60 |
| 5,983,006 | A | * | 11/1999 | Carlson et al. | 716/4 |
| 6,157,903 | A | * | 12/2000 | Hu | 703/14 |
| 6,219,822 | B1 | * | 4/2001 | Gristede et al. | 716/10 |
| 6,223,141 | B1 | * | 4/2001 | Ashar | 703/14 |
| 6,282,693 | B1 | * | 8/2001 | Naylor et al. | 716/8 |
| 6,353,919 | B2 | * | 3/2002 | Sako | 716/8 |

OTHER PUBLICATIONS

NN880495, "Simplified Digital Waveforms for Timing and Delay Fault Simulation of Large–Scale Integrated Circuits", IBM Technical Disclosure Bulletin, vol. 30, No. 11, Apr. 1988, pp. 95–102 (12 pages).*

(List continued on next page.)

*Primary Examiner*—Matthew Smith
*Assistant Examiner*—Phallaka Kik
(74) *Attorney, Agent, or Firm*—John R. Ley, L.L.C.

(57) ABSTRACT

Relevant logic cells and waveforms of a circuit are automatically identified, traced and displayed by using conventional simulation, schematic viewing and waveform viewing tools. The input and output waveforms to and from each logic cell and a transition and a transition time point of each waveform are derived. The output waveform and a selected transition time point identify a predictive input waveform and its transition time, which cause the output signal transition at the selected transition time point. The predictive input signal is the output signal of a preceding, predictive logic cell, thereby identifying the preceding predictive logic cell. Repetitions of this procedure are performed with each new identified predictive logic cell to automatically derive a series or logic cone of cells. Timing margin (set up and hold time) and signal skew (change in signal timing) are derived under best and worst case functional conditions by determining differences in the transition times of the predictive input waveforms for the cells of the logic cone.

22 Claims, 7 Drawing Sheets

OTHER PUBLICATIONS

Lopes de Oliveira et al., "Synthesis of high performance extended burst mode asynchronous state machines", Proceedings of 13th Symposium on Integrated Circuits and System Design, Sep. 18, 2000, pp. 41–46.*

Yun et al., "BDD–based Synthesis of Extended Burst–Mode Controllers", IEEE Transactions on Computer–Aided Design of Integrated Circuits and Systems, vol. 17, No. 9, Sep. 1998, pp. 782–792.*

Bose et al., "Deriving Logic Systems for Path Delay Test Generation", IEEE Transactions on Computers, vol. 47, No. 8, Aug. 1998, pp. 829–846.*

Wu et al., "Timing macromodels for CMOS static set/reset latches and their applications", IEE Proceedings on Computers and Digital Techniques, vol. 135, May 1988, pp. 151–160.*

* cited by examiner

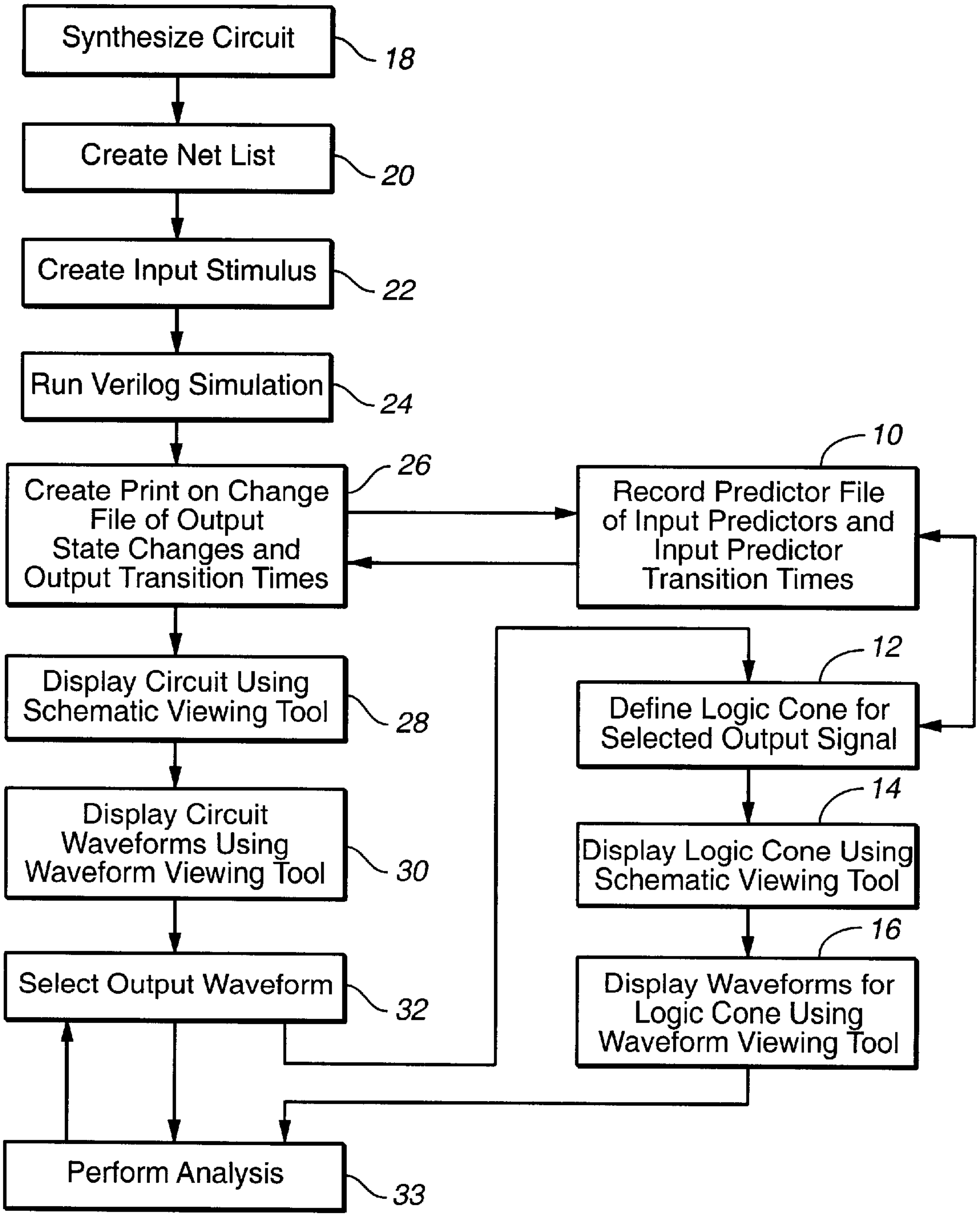
FIG._1

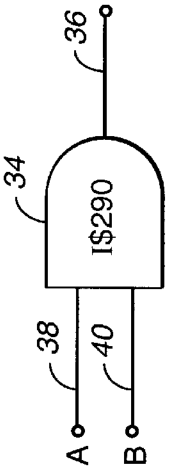
FIG._2
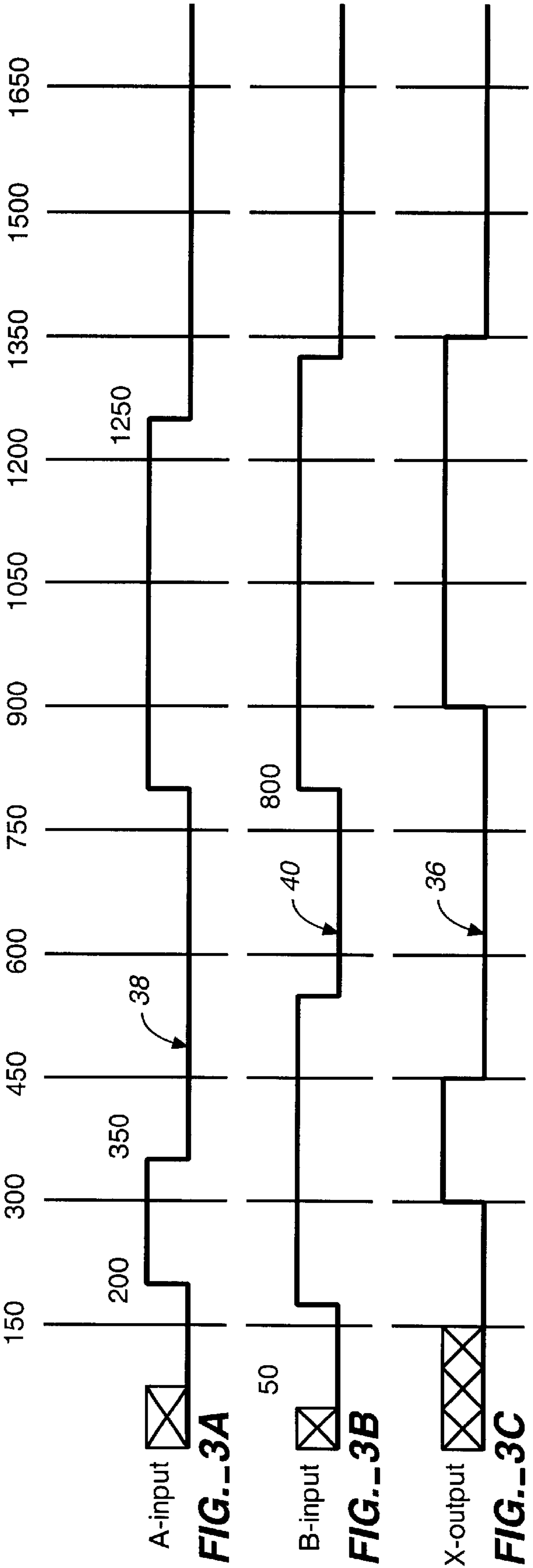
FIG._3A
FIG._3B
FIG._3C

| Output State Change | Output Transition Time (ps) | Input Predictor Transition Time (ps) | Input Predictor |
|---|---|---|---|
| I$290(X) | 0 | 0 | I$290(A) |
| I$290(0) | 150 | 50 | I$290(B) |
| I$290(1) | 300 | 200 | I$290(A) |
| I$290(0) | 450 | 350 | I$290(A) |
| I$290(1) | 900 | 800 | I$290(B) |
| I$290(0) | 1350 | 1250 | I$290(A) |
FIG._4 42
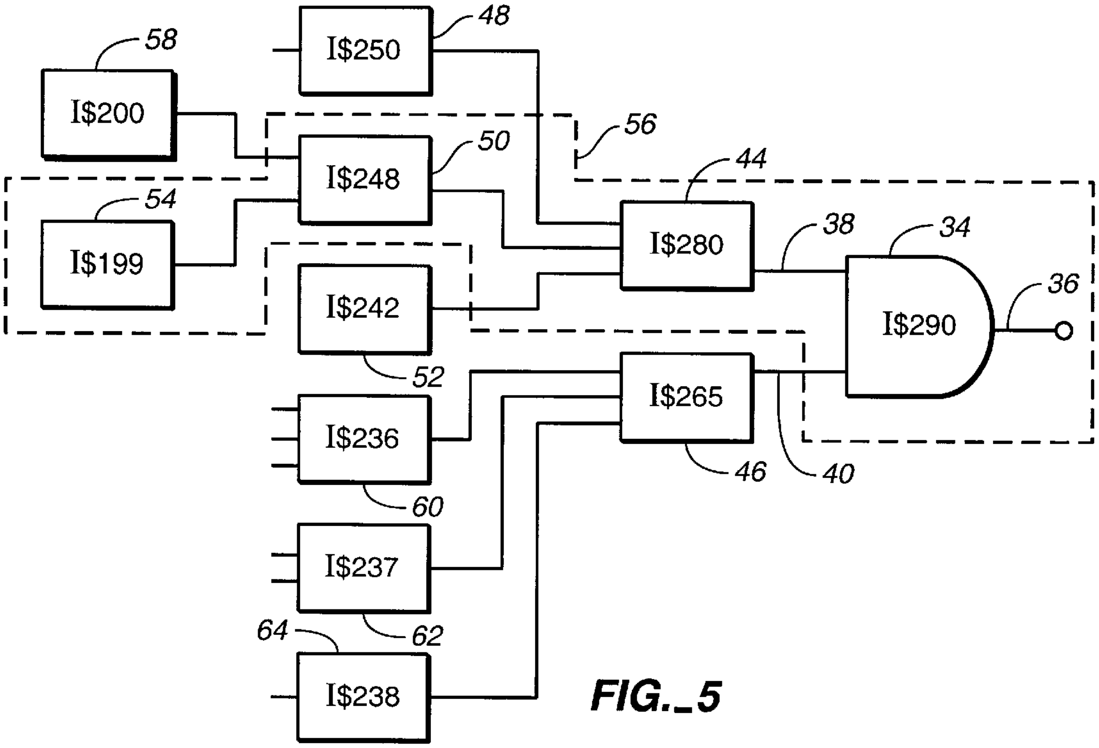
FIG._5
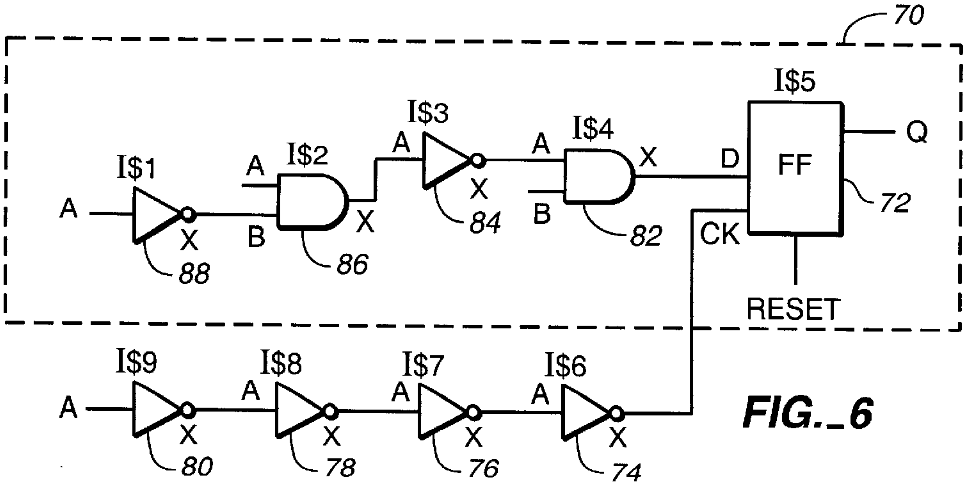
FIG._6

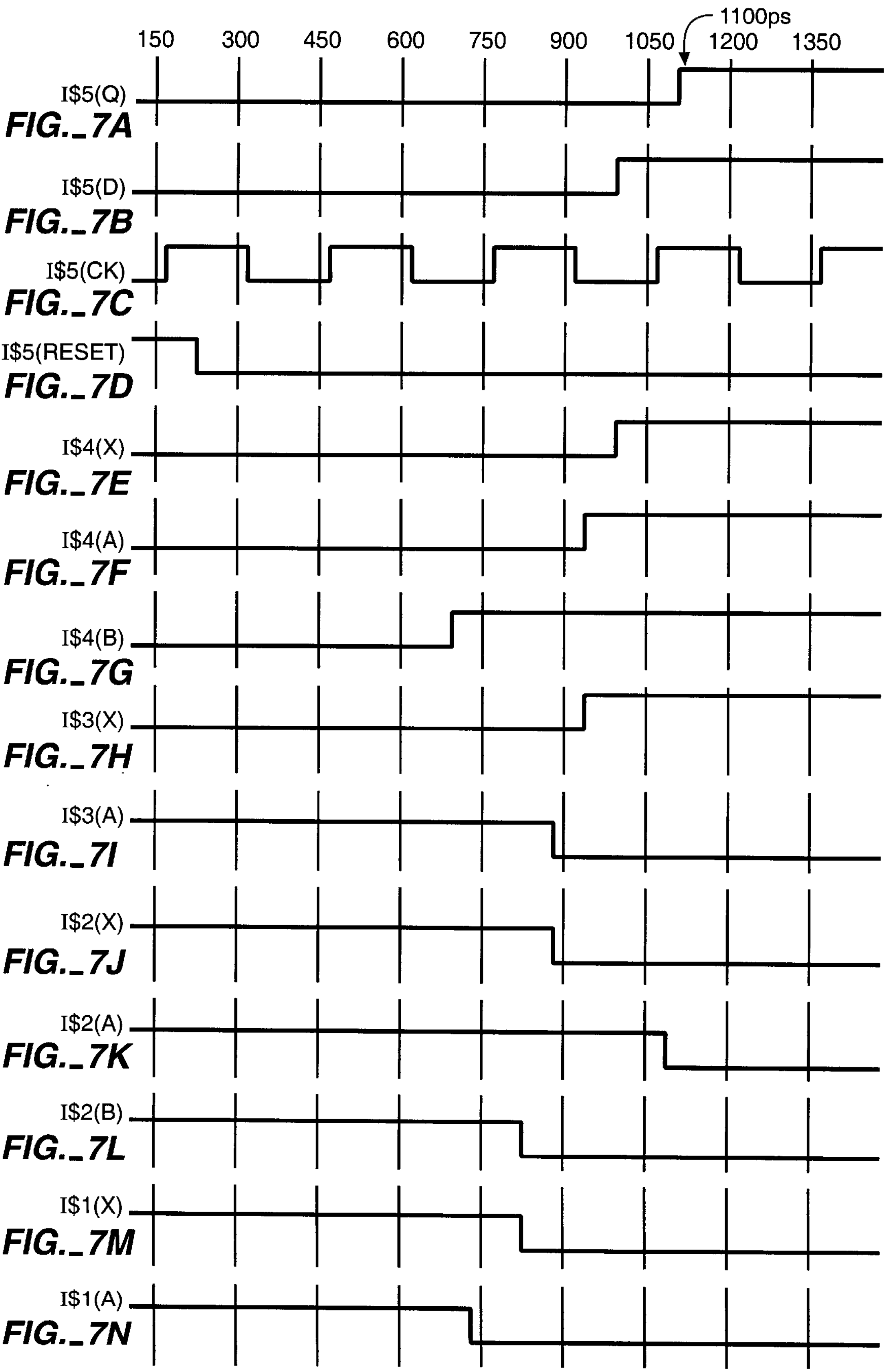
I$5(Q)
FIG._7A
I$5(D)
FIG._7B
I$5(CK)
FIG._7C
I$5(RESET)
FIG._7D
I$4(X)
FIG._7E
I$4(A)
FIG._7F
I$4(B)
FIG._7G
I$3(X)
FIG._7H
I$3(A)
FIG._7I
I$2(X)
FIG._7J
I$2(A)
FIG._7K
I$2(B)
FIG._7L
I$1(X)
FIG._7M
I$1(A)
FIG._7N

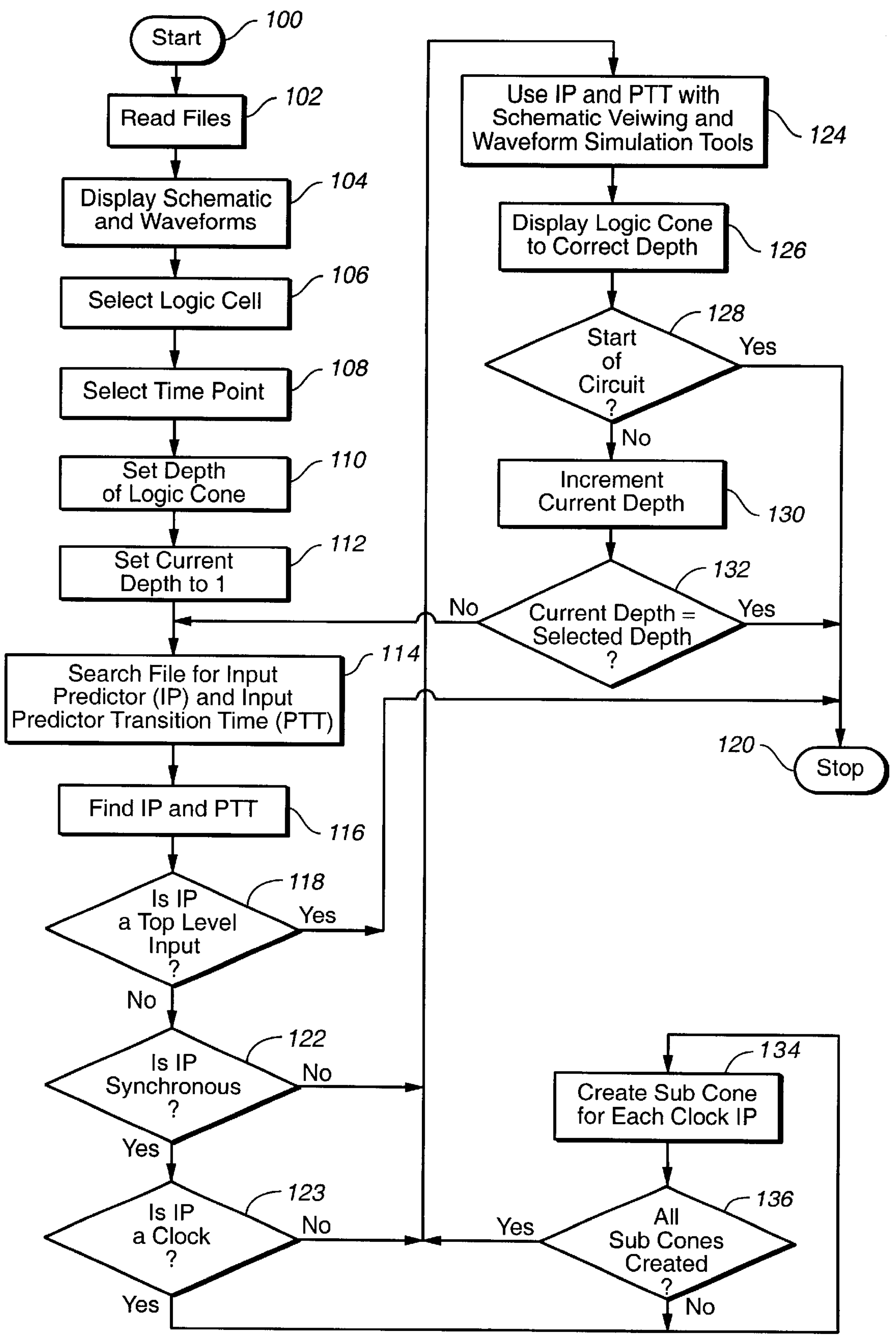
FIG._8

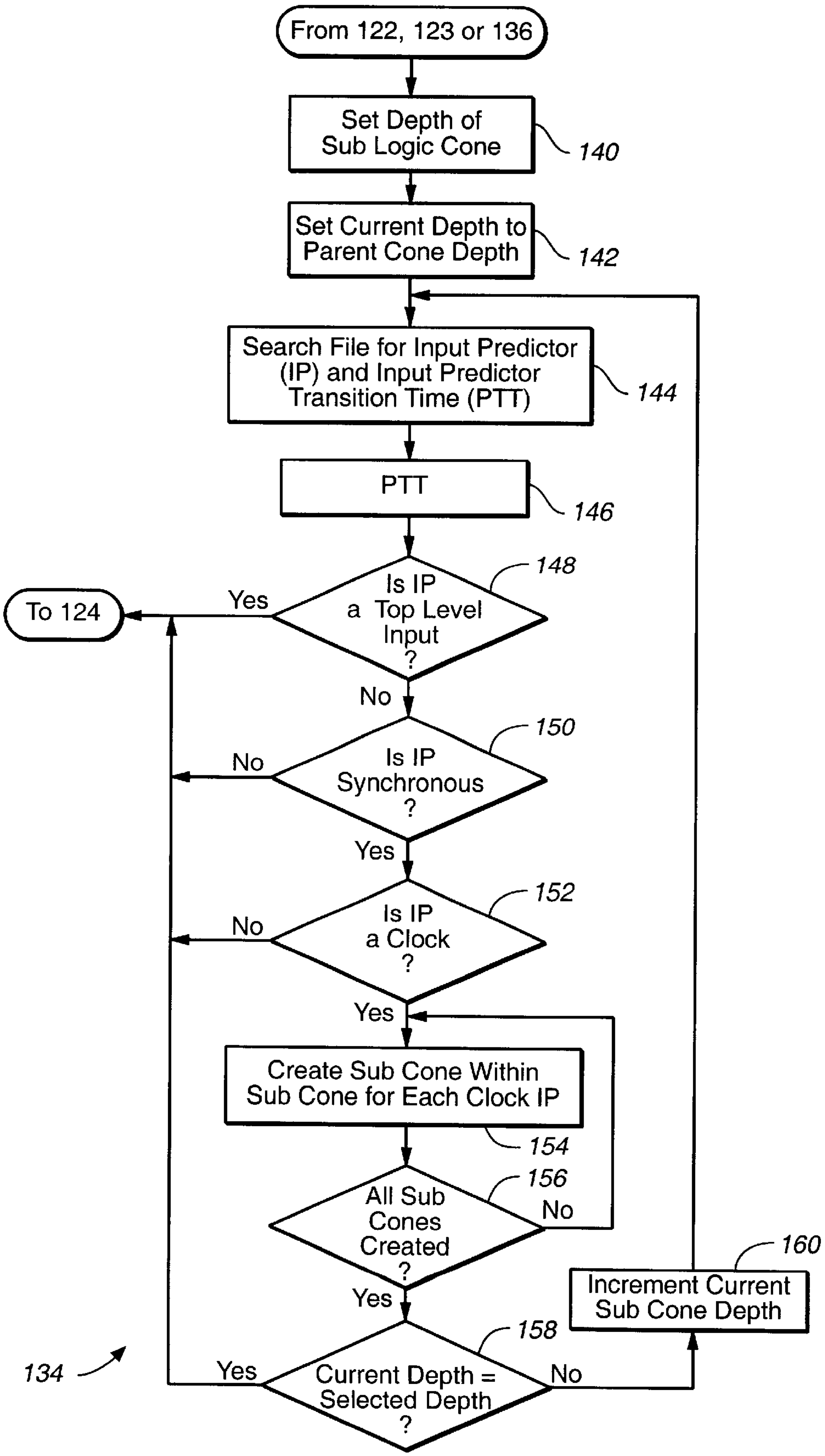
FIG._9

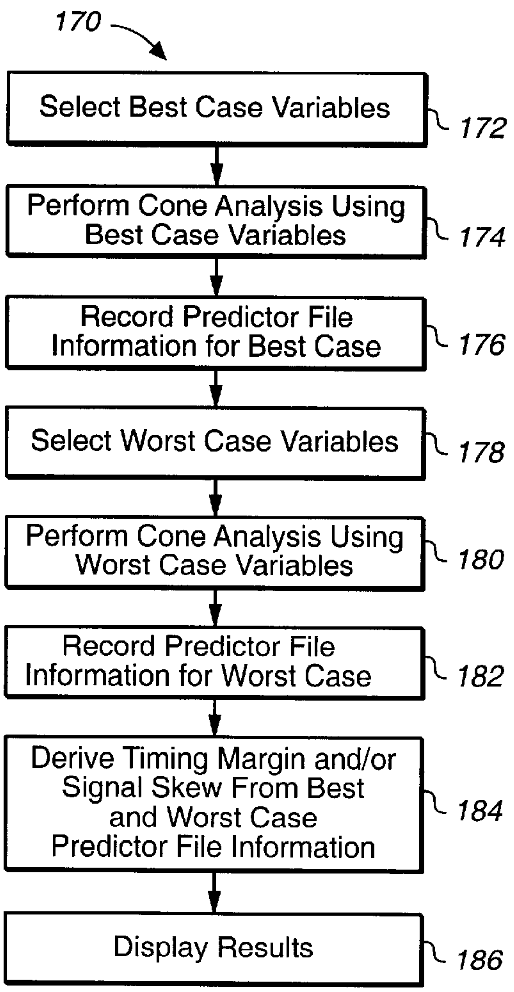
FIG._10
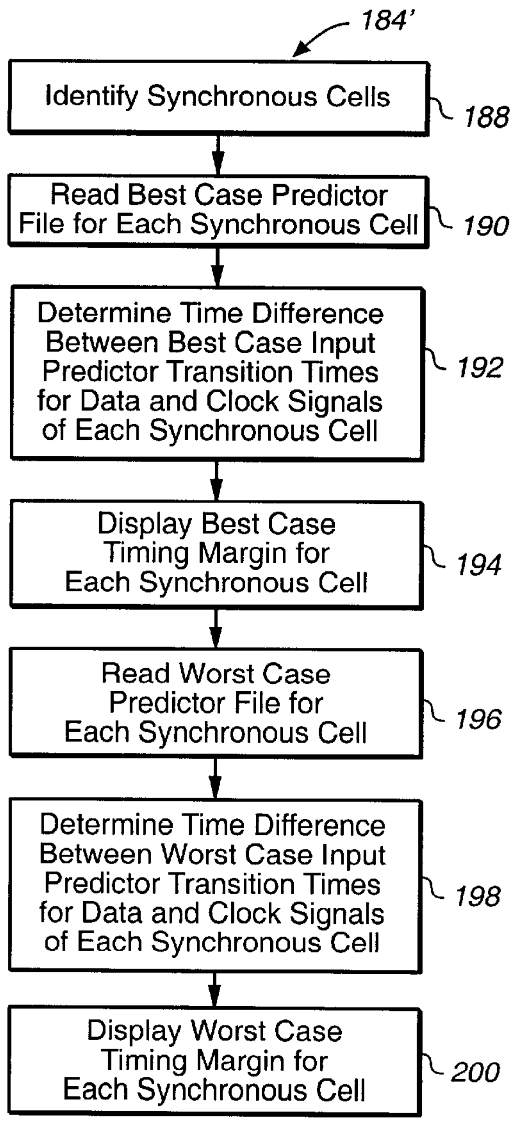
FIG._11
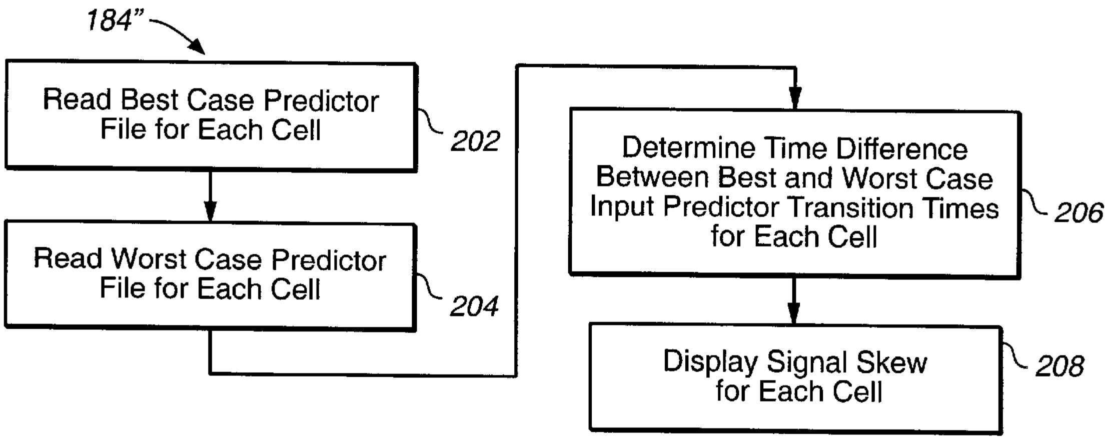
FIG._12

METHOD OF AUTOMATICALLY GENERATING SCHEMATIC AND WAVEFORM DIAGRAMS FOR ANALYSIS OF TIMING MARGINS AND SIGNAL SKEWS OF RELEVANT LOGIC CELLS USING INPUT SIGNAL PREDICTORS AND TRANSITION TIMES

CROSS-REFERENCE TO RELATED INVENTIONS

This invention is a continuation in part of an invention for a Method of Automatically Generating Schematic and Waveform Diagrams for Relevant Logic Cells of a Circuit Using Input Signal Predictors and Transition Times, described in U.S. patent application Ser. No. 09/597,433, filed Jun. 20, 2000. The present invention is also related to an invention for a Method of Automatically Generating Schematic and Waveform Diagrams for Isolating Faults from Multiple Failing Paths in a Circuit Using Input Signal Predictors and Transition Times, described in U.S. patent application Ser. No. 09/684,770, filed concurrently herewith. The present inventor is also the inventor of these other two inventions. All three of these inventions are assigned to a common assignee. The disclosures of these other two U.S. patent applications are incorporated herein by this reference.

FIELD OF THE INVENTION

The present invention relates to methods for analyzing integrated circuits (ICs) during design of those ICs or during failure analysis of those ICs during development. More particularly, present invention relates to a new and improved method of automatically identifying instances of close or unacceptable signal timing skew (signal timing differences) and/or close or unacceptable timing margins (set up and hold times) that might cause or be the cause of functional problems with the IC under differing conditions of temperature, voltage and process. The first above identified invention is utilized with the present improvements in defining a logic cone or rearward extending group of only the relevant circuit components or cells of the IC which cause a particular output signal at a predetermined output signal transition time and the input signals to each relevant cell that predict the functionality of that cell in the cone, to enable the present invention to analyze those cells and their input predictors for close or unacceptable skew and margin. Analysis of the IC during design and failure analysis is facilitated.

BACKGROUND OF THE INVENTION

Most modern semiconductor integrated circuits (ICs) are extremely complex in the number and interconnection of their components or cells. The complexity results from a number of trends in modern electronics. For example, the continual miniaturization of ICs allows more functional cells to be placed on the same sized chip for essentially no additional cost. The cost of an IC is generally related only to the physical size of the substrate upon which the IC is formed and not to the number of components of the IC. Therefore, the effort is to include more cells and functionality in each new IC. The trend in electronics has also been toward integrating entire systems into a single chip, or at least toward integrating larger portions of entire systems into single chips. Such ICs are called application-specific integrated circuits (ASICs) or system level integrated circuits (SLICs). Moreover, most ASICs and SLICs have multiple layers of electrical conductors formed on top of the functional elements of the substrate which connect the various components. These layers of interconnects are also sufficiently complex as to themselves be sources of function-influencing factors of the ASIC or SLIC.

Fabricating a modern, complex IC, such as an ASIC or SLIC, is also a complicated task. The fabrication involves designing the schematic circuitry by using specific cells and connecting them in certain manner, and then simulating the functionality of the schematic circuitry to determine whether the circuitry meets the functional objectives. The design and the simulation are so complex that both functions are generally performed by computer programs or tools designed for those specific purposes. For example, the circuit itself is designed by the use of a behavioral level language, which defines the all of cells in the circuit and their connectivity, and in doing so creates a file known as a netlist which describes those cells and their connectivity. A schematic viewing tool obtains information from the netlist to create a visual display of the circuit and its components. To test the functionality of the circuit, a Verilog simulation program is used. The Verilog simulation program refers to the netlist and additional information which defines the logical function and time delays and other functional factors associated with each of the cells, and develops output state change signals and output transition times for each of the cells in response to a specific input signal. The output state change signals and the output transition times for each of the cells is thereafter displayed by the use of a waveform viewing tool. The waveform viewing tool makes use of the output state change and transition time information derived from the Verilog simulation program to create a display of the waveforms existing at each of the cells in the circuit. The use of behavioral level language circuit synthesis tools and Verilog simulation tools is well-known.

To perform the simulation, the internal functional behavior of each of the cells and the interconnections of the IC are defined within the simulation program. The simulation program also takes into account external influences on the IC from certain variables, such as temperature, voltage and process. The temperature variable takes into account the temperature at which the IC is subjected. In most ICs, when the temperature increases the switching and signal propagation speed of the IC diminishes. The voltage variable relates to the level of voltage of the power applied to the IC. Voltage changes may either increase or decrease the signal switching and propagation times within an particular IC, depending upon the design of the IC. The fabrication process variable refers to signal switching and propagation times differences induced in the IC according to the processing techniques used to build or fabricate the IC. In most cases, the process variable is defined with respect to a nominal process, but slight variations in the fabrication process may result in significant faster or slower signal switching and propagation times than those resulting from nominal fabrication processes.

Many of the logic cells have characteristic performance requirements which must be met in order to achieve reliable and predictable operation. One characteristic timing requirement which applies to synchronous elements, such as flip-flops and clocked latches, is a set up and hold time. A set up time requirement relates to be relative timing between the application of a clock signal and the application of a data signal to the synchronous element. To obtain proper performance of the synchronous element, the data signal must be present and applied to the synchronous element for a certain amount of time prior to the application of the clock signal to that synchronous element. If this set up time requirement is violated, the output signal from the synchronous element is not certain or predictable. The hold time requirement is similar to the set up time requirement, except that the hold time requirement relates to the amount of time that the data signal must be applied to the synchronous element after the clock signal was applied. Again, the purpose of the hold time requirement is to assure a guaranteed and predictable response from the synchronous element. The set up and hold time requirement is frequently referred to as a "timing margin" requirement. The term "race condition" is sometimes used to describe a violation of a set up and hold time requirement. Obviously, race conditions are to be avoided because they are indicative of unpredictable and uncertain functionality.

Another performance characteristic relates not so much to the requirements applicable to the cells themselves, but to the functionality achieved by groups of interconnected cells. Generally speaking, the design of the IC presumes that the signals applied to each of the logic cells will occur in predetermined relationships with respect to other timing events occurring within the IC. Many logic cells require the simultaneous application of numerous signals to achieve proper functionality, and in many cases two or more of those signals must be applied within a certain time window in order for the logic cell to perform its intended to function. The predictable arrival of the signals at the logic cells is the foundation for the logic design of the IC itself. Differences or skew in the timing of the signals therefore has an important and significant impact on the functionality of the IC.

Each simulation takes into account the external variables of temperature, voltage and process. Under those conditions, the proper functionality of the IC is determined, primarily by an indication of whether an output signal or signals behave as expected in response to a selected input signal. So long as the output signal or signals behave properly, the typical simulation does not consider or evaluate timing margin or signal skew with respect to the numerous internal logic cells, all of which contribute to the output signal behavior. However, since the influences of the external variables of temperature, voltage and process are recognized as having the potential to change the output signal behavior from the IC, it is also typical to run best case and worst case simulations. A best case simulation is a selected permutation of the temperature, voltage and process variables, sometimes referred to as a "corner," where it is expected or anticipated that those variables will influence the IC to have the fastest signal generation, timing, propagation and response. A worst case simulation is a different selected permutation of the temperature, voltage and process variables which is expected or anticipated to cause the IC to have the worst signal generation, timing, propagation and response functional characteristics.

Running the best case and worst case simulations allows the circuit designer to evaluate the functionality of the IC under an anticipated range of operating conditions. If the IC functions as anticipated and expected under the best case and worst case simulations, usually no effort is made to evaluate the functionality of the internal logic cells of the IC. Some prior art simulation programs have a limited capability to evaluate timing margin. These prior art margin tools work in conjunction with a simulation program to establish a timing window for each synchronous logic cell of the IC. The timing window is used to evaluate whether the data and clock signals to that synchronous logic cell occur within the set up and hold time. So long as the data and clock signals occur within the set up and hold time window, no report is generated and no attention is directed any of the logic cells. Moreover, it is not possible to get reports on those logic cells that experience set up and hold times which are marginal or close but do not violate such timing window. Furthermore, those logic cells which experience set up and hold time violations are reported for the entire IC, and other than to report those cells with timing margin violations, the prior art timing margin tool does nothing more to assist in tracing or otherwise understanding the cause of the failure.

The acceptability of the IC under the simulated best and worst case conditions is predicated upon the simulated best and worst case conditions actually duplicating the conditions which the IC will actually experience in use. Because of the increased complexity of modern ASICs and SLICs, and certain assumptions which must necessarily be made in simulating the functionality of the cells and their interconnects, there may be a significant discrepancy between the simulated worst and best case conditions and the actual conditions which the IC may practically experience. Moreover, because of the permutational influences of the temperature, voltage and process variables, coupled with the somewhat assumptive nature of the response characteristics of components within modern complex ASICs and SLICs, particularly the response characteristics of the interconnect layers, it may questionable that the selected permutation of variables actually represents the best and worst case scenarios.

In those cases where a failure of performance is recognized in either a worst case or a best case simulation, a very tedious, time-consuming and step-by-step manual analysis of the internal logic cells is typically performed. The previous invention which is mentioned first above (Ser. No. 09/597,433) greatly simplifies the process of circuit analysis under such failure conditions, by obtaining new information from the simulation to identify and locate only the relevant logic cells which contribute to the failure. However, the previous invention is primarily useful in detecting failure conditions in the circuit, not evaluating the reliability of performance under marginal conditions.

These and other considerations have given rise to the present invention.

SUMMARY OF THE INVENTION

One aspect of the present invention relates to applying the previous invention (Ser. No. 09/597,433) in a new methodology to simulate and thereby analyze the functionality of the logic cells of the IC under marginal conditions, even when simulations of the overall functionality of the IC show proper behavior in best and worst case scenarios. In this manner, the present invention may be used as an effective circuit design tool to make it more likely that the IC will perform as intended, even conditions which may not be anticipated or selected for simulation.

Another aspect of the present invention permits the circuit designer to evaluate timing margins of the logic cells and their signals within the IC, to thereby identify tight timing margins which might give rise to race conditions. By evaluating the tight timing margins with respect to each logic cell, those signal timing situations which are close to creating a set up and hold violation may be identified, even though the tight signal timing slightly avoids a set up and hold time violation.

A further aspect of the present invention permits the circuit designer to evaluate the skew between signals at each of the logic cells of the IC, thereby identifying signal skew situations which might result in malfunctions, even when the signal skew was not great enough to cause circuit failure during simulation. By evaluating the timing margin and signal skew even under conditions of proper but marginal functionality, the circuit designer is able to identify and correct those functional considerations which may result in circuit failure under actual use conditions which were not adequately anticipated by the simulation.

Lastly, a further aspect of the present invention relates to selecting and determining conditions for simulating the behavior of an IC which more truly represent an actual worst case or best case scenario. The use of the present invention allows the IC designer to determine the permutational influence of the variables on the functionality of the IC to determine the best case and worst case scenarios. By selecting and adjusting the permutation of the variables for each best and worst case scenario, the timing margin and the signal skew can be observed. When the permutation of the variables results in the best and worst case conditions of timing margin and/or signal skew, that permutation of variables constitutes the best and worst case scenarios. Determining the actual best and worst case scenarios for simulation purposes provides an added degree of confidence that the simulation is likely to have accounted for the actual best and worst case conditions to which the IC will be subjected in actual use. Accordingly, the IC can be designed and simulated to provide a greater level of reliability and robust functionality under a variety of conditions.

To achieve these and other aspects, the present invention involves a method of deriving one of timing margin or signal skew information from relevant ones of a plurality of connected logic cells and waveforms from the logic cells of a circuit. The method makes use of a circuit simulation tool to describe input and output waveforms to and from each logic cell and a transition of the waveforms and a transition time point when the transition occurs in each waveform. The steps of the method comprise selecting the output waveform and a transition time point of the selected output waveform delivered from a selected logic cell, identifying a predictive input waveform and a transition time of the predictive input waveform to the selected logic cell which causes the transition of the output signal from the selected logic cell at the selected transition time, and identifying a predictive logic cell connected to the selected logic cell which supplies the output waveform to the selected logic cell which constitutes the predictive input waveform previously identified. At least one new repetition of these three steps is performed under circumstances where the predictive logic cell identified in a previous repetition becomes the selected logic cell for the new repetition and the transition time point of the predictive input waveform to the selected logic cell of the previous repetition becomes the selected transition time of the output waveform of the selected logic cell for the new repetition. The repetitions define a logic cone formed from each of the logic cells selected and identified by performing the repetitions. The magnitudes for variables influencing the performance of the circuit under best case circumstances and worst case circumstances are thereafter selected. A first and a second instance of the logic cone is defined by using best case and worst case variable magnitudes. Timing margin or signal skew information is derived from the difference in transition times of the predictive input waveforms from the first and second instances of the defined logic cone.

Other preferred aspects and steps of the method of the present invention relate to displaying a schematic diagram of the selected and predictive logic cells identified from all of the repetitions, and displaying the input and output waveforms of the selected and predictive logic cells identified from the all of the repetitions, preferably by using a conventional schematic viewing tool and a conventional waveform viewing tool.

The method also preferably involves deriving the timing margin information of a synchronous cell which has a predictive data input waveform and a predictive clock input waveform, by determining the transition time of a selected predictive data input waveform to the synchronous cell, determining the transition time of the selected predictive clock input waveform to the synchronous cell, and determining the timing margin information for the synchronous cell from the difference in the transition times of the selected predictive data and clock input waveforms. Such timing margin information is preferably derived separately for each of the best case and worst case instances.

Another preferable aspect of the invention involves deriving the signal skew information of a selected logic cell in the best and worst case performance instances of the defined logic cone. The transition time of a selected predictive input waveform of the selected cell is determined for the best case and for the worst case, and any difference in the determined transition times is the signal skew caused by best case and worst case performance differences.

The variables and their magnitude influence the occurrence of the predictive input waveform and the transition time of the output waveform for each logic cell, and selecting the variable magnitudes preferably involves selecting different variable performance information for the best and worst cases. The variable performance information relates to temperature of the circuit, magnitude of voltage applied to the circuit, and a semiconductor fabrication process used to manufacture the circuit. In general this variable performance information describes a time delay associated with each logic cell and the interconnect conductors extending between logic cells.

Further preferred features of the method identify the predictive input waveform as a synchronous waveform, such as a clock waveform. As a part of defining a cone of connected predictive and selected logic cells by performing the repetitions, the cone may include a sub-part which involves a synchronous logic cell which causes a synchronous waveform. In such a case, the the same type of repetitions are performed to define the sub-part of the cone.

The timing margin and signal skew of the cells of a cone of logic cells is determined by using the input predictor signal, the input predictor signal transition time, the output state change signal and the output state change signal transition time. This information identifies the relevant ones or a cone of logic cells which are responsible for causing the output waveform transition at the selected time. The schematic and waveform viewing tools utilize this information to assemble the relevant schematic diagrams and waveform simulations. This assembled information facilitates a rapid and clear understanding of the functionality of the relevant logic cells under the best case and worst case timing margin and signal skew situations. The timing margin and signal skew information is available for all the cells within the logic cone. The timing margin and signal skew information is readily available to facilitate a complete understanding of the performance of the circuit, even under conditions where a failure or malfunction is not indicated by the simulation tool.

A more complete appreciation of the present invention and its scope may be obtained from the accompanying drawings, which are briefly summarized below, from the following detailed descriptions of presently preferred embodiments of the invention, and from the appended claims.

BRIEF DESCRIPTION OF THE DRAWINGS

FIG. 1 is a general flowchart of the base methodology of the present invention interrelated to other conventional steps of creating and simulating the functionality of a circuit using conventional schematic viewing, waveform viewing and simulation tools.

FIG. 2 is a schematic diagram of an exemplary and conventional AND gate, a which has been created, identified and simulated as shown in FIG. 1.

FIGS. 3A, 3B and 3C are waveform diagrams illustrating the operation of the AND gate shown in FIG. 2, which have been simulated as shown in FIG. 1.

FIG. 4 is a table illustrating the contents of a conventional print on change file and a predictor file, which collectively contain output state change responses, output transition times, input predictor transition times, and input predictor identifications, for the AND gate shown in FIG. 2, created by steps shown in FIG. 1.

FIG. 5 is a schematic diagram of the AND gate shown in FIG. 2, to which a number of other preceding levels of exemplary logic cells have been connected, illustrating the results of a step of defining a logic cone as shown in FIG. 1.

FIG. 6 is a schematic diagram of other exemplary logic circuitry, also illustrating the results of a step of defining a logic cone as shown in FIG. 1.

FIGS. 7A, 7B, 7C, 7D, 7E, 7F, 7G, 7H, 7I, 7J, 7K, 7L, 7M and 7N are waveform diagrams of the logic cone of the exemplary logic circuitry shown in FIG. 6, shown on a common time axis, and generated and displayed by a conventional waveform simulation tool according to the method shown in FIG. 1.

FIG. 8 is a more detailed flowchart of certain steps of practicing the method more generally shown in FIG. 1.

FIG. 9 is a more detailed flowchart of one of the steps of the method shown more generally in FIG. 8.

FIG. 10 is a flowchart of the steps of the present invention, accomplished using the basic methodology shown in FIGS. 1–9.

FIG. 11 is a more detailed flowchart of the step shown in FIG. 10 of deriving timing margin information.

FIG. 12 is a more detailed flowchart of the step shown in FIG. 10 of deriving signal skew information.

DETAILED DESCRIPTION

The present invention makes use of the basic methodology described in the previous invention first described above (Ser. No. 09/597,433). The following description of FIGS. 1–9 is reproduced from Ser. No. 09/597,433. The new and improved aspects of the present invention build on this basic methodology, and are described below in connection with FIGS. 10–12.

The basic methodology used in the present invention is illustrated by steps 10, 12, 14 and 16, shown in FIG. 1. The basic methodology depends on and interacts the conventional steps involved in circuit synthesis, waveform simulation of the synthesize circuit, and analysis of the circuit and its waveforms, as shown at steps 18, 20, 22, 24, 26, 28, 30, 32, and 33. In performing these conventional steps, and in performing the steps of the basic methodology of the present invention, a conventional circuit synthesizing program or tool, which employs a well-known behavioral level language, is employed at step 18 to create the netlist which occurs at step 20. Similarly, a conventional simulation program or tool, which employes a well-known language such as Verilog, is used at step 24 to perform a simulation on the circuit defined at steps 18 and 20. In addition, a well-known schematic viewing program or tool is used at steps 14 and 28 to display an electrical circuit schematic diagram of the circuit which has been synthesized at steps 18 and 20. Lastly, a well-known waveform viewing program or tool is used at steps 16 and 30 to display the selected waveforms from the electrical circuit which is displayed at steps 14 and 28, respectively. The circuit synthesis tool used at step 18, the circuit simulation tool used at step 24, the schematic viewing tool used at steps 14 and 28, and the waveform viewing tool used at steps 16 and 30 are all well-known and widely used in the field of semiconductor and electrical circuit design and test. An example of schematic viewing and waveform viewing tools which are suitable for use with the present invention are those known as "Gate Vision," made by EDA Direct, and "Signal Scan," made by Cadence. The methodology of the present invention depends upon the use and operation of these conventional tools, as described in more detail below.

An example of the operation of the conventional circuit synthesis and schematic viewing tools is illustrated very basically in FIG. 2. As shown in FIG. 2, the circuit synthesis tool (used at step 18) has created a conventional AND logic gate 34, which has been designated in the netlist (created at step 20) as "I$290." The schematic viewing tool has displayed the AND logic gate 34. The AND gate 34 has an output terminal designated "X" (as shown in FIG. 2) where its output signal is present at 36. The output signal at 36 results from a logical combination of input signals applied at 38 and 40 respectively to the two input terminals designated as "A" and "B." A combination of two logic high input signals 38 and 40 results in a logic high output signal at 36, and any combination of one logic high and one logic low input signal or two logic low input signals results in a logic low output signal at 36, in accordance with the conventional operation of the AND gate 34. The AND gate 34 is an example of a logic cell to which the signal skew analysis of the present invention pertains.

An example of the use and operation of the conventional Verilog simulation tool (step 24, FIG. 1) and the waveform viewing tool (steps 16 and 30 shown in FIG. 1) is illustrated in FIGS. 3A, 3B and 3C, for the AND gate 34 shown in FIG. 2. The waveform viewing tool creates an output waveform 36, FIG. 3C, in response to the states (logic high and logic low) of the input waveforms 38 and 40, FIGS. 3A and 3B, respectively. The simulation tool recognizes the logic function achieved by the AND gate 34, and simulates the output signal 36 based on the input signals 38 and 40. The simulation tool performs its function for each logic cell or component of the circuit and creates a "print on change" file which contains information that describes the output state signal transitions from each logic cell and the time that those output transitions occur. The waveform viewing tool must interact with a "print on change" file of information created for each component or logic cell of the circuit in creating the output signals and the output change state transition times associated with those output signals. The waveform viewing tool interacts with this print on change file to develop and present the output signals.

In addition to defining the logic function and the states of the output signals, the simulation tool also accounts for the delay time associated with the operation of each logic cell. For example, each logic cell has a finite time delay involved from the transition of the input signals until the output signal is presented from the logic cell. The time delays for standard logic cells are determined by semiconductor fabrication processes, and are influenced by other factors such as voltage and temperature. The simulation tool records those delays and allows adding information defining the time delay associated with each logic cell, depending on the process, voltage and temperature.

The simulation tool simulates output signals in response to a selected input stimulus signal, which is selected and applied at step 22 (FIG. 1). The input stimulus signal is selected and established to occur at a predetermined starting time point, which the simulation tool also uses as a reference point with respect to timing all of the output state transitions associated with all of the logic cells. In the case of the simulated waveform diagrams shown in FIGS. 3A, 3B and 3C, for the AND gate 34 (FIG. 2), the relative timing is illustrated as beginning at zero when the two input stimulus signals 38 and 40 are applied to the input terminals A and B of the AND gate 34 (FIG. 2). The waveform viewing tool also keeps track the level of the signals at each time point after the beginning input stimulus is applied.

The input signal 38 at the A input terminal of the AND gate 34 (FIG. 2) is indeterminate for a period of time, for example approximately 75 picoseconds, before the signal 38 achieves a stable logical low-level, as shown in FIG. 3A. The input signal 40 at the B input terminal of the AND gate 34 (FIG. 2) is also indeterminate for short period of time of approximately 50 picoseconds, as shown in FIG. 3B. At approximately 50 picoseconds, the input signal 40 stabilizes at a logic low level. The stabilized low-level input signal 40 will cause the output signal from the AND gate 34 to achieve a low-level, because of the logic functionality of the AND gate 34. The delay time for the AND gate 34 is 100 picoseconds, in this example, causing the output signal 36 to achieve a stable low-level value at 150 picoseconds. The output signal 36 from the AND gate 34 (FIG. 2) is indeterminate from the zero time point until the time point at approximately 150 picoseconds, because of the time delay of the AND gate 34 and the indeterminate status of the input signals 38 and 40 for the first 50 picoseconds. The output signal from the AND gate 34 will not stabilize until after approximately 100 picoseconds have expired after the 50 picoseconds time point when the B input signal first stabilized. At approximately the 150 picosecond time point, the output signal 36 from the AND gate 34 has stabilized at a logic low level, as shown in FIG. 3C. In this example, the predictor of the output signal 36 stabilizing at a logical low-level is the stabilization of the B input signal at the 50 picosecond time point.

At the 170 picosecond time point, the input signal 40 transitions to a logic high level, and thereafter at approximately the 200 picosecond time point, the input signal 38 transitions to a logic high level. At this 200 picosecond time point, both input signals to the AND gate 34 are at a logic high level, which will result in the output signal 36 achieving a logic high level after the 100 picoseconds time delay associated with the AND gate 34. So at 300 picoseconds, the output signal 36 from the AND gate 34 (FIG. 2) goes to a logic high level. The transition of the input signal 38 from a logic low state to a logic high state at the 200 picosecond time point predicts that the output signal 36 will transition to the logic high state. Thus, in this example, the input signal 38 at the A input terminal of the AND gate 34 (FIG. 2) is the input predictor for the output signal transition at the 300 picosecond time point.

At 350 picoseconds, the input signal 38 transitions to a logic low level (FIG. 3A), which will cause and predict that the output signal 36 should go to a logic low level after the 100 picosecond time delay of the AND gate, which thereafter occurs at the 450 picosecond time point. Thus, the transition of the input signal 38 at the 350 picosecond time point is the input predictor for the transition of the output signal 36 from the logic high state to the logic low state at the 450 picosecond time point.

At 520 picoseconds, the input signal 40 transitions from a logic high state to a logic low state. This transition has no effect on the output signal from the AND gate 34, because the other input signal 38 is already at a logic low state.

At 780 picoseconds, the A input signal 38 transitions from a logic low to a logic high state, and thereafter at 800 picoseconds, the B input signal transitions from a logic low state to a logic high state. With both input signals 38 and 40 at logic high states at the 800 picosecond time point, the output signal 36 will transition to a logic high state after the 100 picosecond time delay associated with the AND gate 34. This transition occurs at 900 picoseconds. Because the B input signal 40 caused the transition of the output signal at the 900 picosecond time point, the B signal 40 is the input predictor of the transition which occurs at 900 picoseconds.

At 1250 picoseconds, the A input signal 38 transitions to a logic low state, thereby causing and predicting that the output signal 36 will transition to a logic low state after the expiration of the 100 picosecond time delay associated with the AND gate. The transition of the output signal 36 from the logic high state to the logic low state occurs at the 1350 picosecond time point. The transition of the B input signal 40 from the logic high state to the logic low state at the 1320 time point has no affect on the output signal from the AND gate, because of the previous transition of the A input signal 38 at the 1250 picosecond time point.

The simulation tool (step 24, FIG. 1), which is illustrated by FIGS. 3A, 3B and 3C, develops the transitions of the output digital logic signals based on the logical function of the logic cell in question, the time points of the input signal transitions, the time delay associated with a logic cell in question, and the level of the input signals at the transition times of those input signals. The information is derived for each logic cell of the circuit. The output signal state change and the output signal transition times associated with each state change for each logic cell are stored in a "print on change" file, as it is typically called in Verilog simulations. The creation of this print on change file is shown at step 26 in FIG. 1.

In conventional circuit simulation and analysis, as shown in FIG. 1, the netlist created at step 20 is accessed by the conventional schematic viewing tool to display the circuit diagram, as shown at step 28. In addition and conjunctively, the print on change file, which was created at step 26, is accessed by the conventional schematic viewing tool and the waveforms for selected logic cell are displayed at step 30. The user thereafter selects one of the output waveforms, as shown at step 32, and performs a typical manual analysis previously described at step 33.

Storing the output signal state change transition and timing information for each logic cell in the circuit allows the waveform viewing tool to display the output waveforms from each of the logic cells, in the conventional manner described. However the logic cells which are analyzed must be selected manually by the user, specifically choosing the logic cell in question and then manually working backwards by analyzing each of the input signals and the source of those input signals to determine the cause of any failures or anomalies in the circuit, during a conventional analysis step 33. These disadvantages associated with such a manual analysis are overcome by the basic methodology of the present invention.

The first step 10 of the basic method, as shown in FIG. 1, involves creating a predictor file of information simultaneously with the print on change file of information created at step 26. The predictor file of information created at step 10 is derived from the operation of the Verilog simulation tool at step 24 (an example of which has been described in conjunction with FIGS. 3A, 3B and 3C). The predictor file created at step 10 and the print on change file created at step 26 (FIG. 1) contain the information of table 42 shown in FIG. 4. The print on change information contained in table 42 is the information contained in the two most left-hand columns of table 42, and the new predictor information created as a part of the basic methodology of the present invention is the information contained in the two most right-hand columns of table 42. The print on change file information and the predictor file information is made available by operating the simulation tool (step 24, FIG. 1). The basic method of the present invention collects that information represented by table 42, and utilizes that information in a manner to achieve significant improvements and advantages.

The print on change information contained in table 42 (the two left-hand columns, FIG. 4) is derived and exists for each logic cell of the circuit as a result of running the simulation program (step 24, FIG. 1). The information contained in the table 42 identifies the selected logic cell, the output state change or transition of that selected logic cell, and the time of the output signal transition. In the example shown in table 42, the selected logic cell is the AND gate I$290 shown in FIG. 2. As shown in table 42, an output state transition or change to a logic low level is indicated by a "(0)" following the logic cell designation (I$290), and an output state transition or change to a logic high level is indicated by a "(1)" following the logic cell designation (I$290). Both the selected logic cell and its output state or transition are identified in the first column of table 42. The time that the output state or transition occurs is shown in the second column of table 42. The output signal transition time that is shown in the second-from-the-left column is measured and accounted for by the simulation tool relative to the application of the input stimulus signal (step 22, FIG. 1). In other words, the application of the input stimulus signal constitutes the beginning time point from which all the signals relevant to all of the logic cells within the circuit are calculated by the simulation tool (step 24, FIG. 1).

In addition to designating the selected logic cell, its output state transition and the time of that transition, predictor file information is also gathered. Preferably the predictor file information is stored in conjunction with the print on change information, or the predictor file information is linked to the print on change information. The new predictor file information collected in accordance with the basic methodology of the present invention is shown in the two right-hand columns of the table 42 shown in FIG. 4. Table 42 shows an input predictor in the fourth column which caused the output signal transition in the first column. In the example of the AND gate 34 (FIG. 2) described in conjunction with FIGS. 3A, 3B and 3C, the transition of the output signal to the logic low state ("I$290(O)") at the 150 picosecond time point occurred as a result of the transition of the B input signal 40 (I$290(B)), as shown in the fourth column of FIG. 4, at the 50 picosecond time point. Thus, the input predictor to the AND gate 34 (I$290) is the B input signal 40 (FIG. 2), which is recorded in the fourth column of table 4 as the input predictor of the output state change which occurred at the 150 picosecond time point. The input predictor, in this example, is designated with respect to the selected logic cell upon which it has its effect (I$290) and with regard to the B input signal to that selected logic cell (I$290(B)).

The information contained in table 42 also includes, in the third column, the transition time when the input predictor signal occurred. In the case of the input predictor signal (I$290(B)) that signal transitioned into a state which caused it to become the input predictor at the 50 picosecond time point, as has been discussed in conjunction with FIGS. 3B and 3C above. As is discussed more completely below, the identification of the input predictor and the input predictor transition time allows the cone logic to be automatically identified for each preceding level or stage of logic within the circuit.

As a further example of the input predictor and input predictor transition time information contained in the fourth and third columns of table 42, respectively, the transition of the output signal of the AND gate 34 (FIG. 2) from the logic of low state to the logic high state (I$290(1)) which occurred at the 300 picoseconds time point is the result of the A input signal to the AND gate 34 (I$290(A)). The A input signal, which constitutes the input predictor (1$290(A)), transitioned to a logic high level at the 200 microsecond time point (FIG. 3A) . Other similar input predictor and input predictor transition time information is recorded for all of the other output signal transitions from the AND gate at all of the output signal transition times at 450, 900 and 1350 picoseconds, as shown in FIG. 4.

The information contained in the third and fourth columns of table 42 is obtained by operating the simulation tool (step 22, FIG. 1). Additional software is written to collect and record the input predictor and input predictor transition time information shown in the third and fourth columns of table 42, and to correlate that information with the selected logic cell, its output state transition and its output transition time recorded in the first and second columns of the table 42. The information defining the input predictor and the input predictor transition time is inherently used by the simulation tool to determine the output state change signal and the output signal transition time of the print on change file, so that input predictor and input predictor transition time information is available to be extracted from the conventional simulation program and recorded in the predictor file at step 10 (FIG. 1) for each cell of the circuit, in the manner as has been described in conjunction with table 42 (FIG. 4).

The information in the predictor file created at step 10 is next used with the information contained in the print on change file created at step 26 to define a logic cone, as shown in FIG. 1 at step 12. To define the logic cone, at step 12, the input predictor information from the predictor file (table 42, FIG. 4) identifies the input signal to the selected logic cell which causes the output transition. This input signal to the selected logic cell was supplied by a different, preceding logic cell located one logic level previous to the selected logic cell. By reference to the circuit defined by the netlist established at step 20, the previous logic cell is identified and automatically included in the logic cone defined at step 12. The input predictor and input predictor transition time for this previous logic cell is then identified by reference to the predictor file for that previous logic cell, and the logic cell in front of it is thereby identified by reference to the netlist and included in the logic cone defined at step 12. Similar iterations are performed for each preceding level of logic cells, to the extent of the number of logic levels selected by the circuit analyst. Once all of the preceding logic cells have been identified, the logic cone is complete at step 12.

The complete logic cone which is defined at step 12 is a series or chain of preceding logic cells which are connected together according to the schematic diagram and which have been selected as a result of their output signals having been the input predictors causing the output transitions of the next subsequent ones of the logic cells in the series or chain. This logic cone is established with reference to a particular output signal transition from the selected logic cell which occurs at a particular output signal transition time, as selected by the analyst. A different cone of logic will exist for output signals at other, different selected output transition times, in most cases.

The step 12 (FIG. 1) of defining the logic cone is illustrated in FIG. 5. At a particular output signal transition time point selected by the analyst, the output signal 36 (FIG. 3C) is selected. Using the output transition time information (second column, table 42, FIG. 4), the input predictor of that output transition is identified (fourth column, table 42, FIG. 4). The transition time of that input predictor is also obtained (third column, table 42, FIG. 4). The input predictor of the AND gate 34 (I$290) is the output signal of a logic cell in a preceding level of logic represented by the logic cells 44 and 46 (I$280 and I$265, respectively). For example, assume that the time point for analysis of the output signal 36 from the AND gate 34 is at 320 picoseconds (FIG. 3C). The input predictor for this output signal transition is the A input signal 38 (I$290(A), FIG. 4). As shown in FIG. 5, the output signal from the logic cell 44 (I$280) is the A input signal 38. The simulation tool uses the 200 picosecond time point for the A input signal 38 (FIG. 3A) and the time delay associated with the logic cell 44, to determine which of the input signals to logic cell 44 (from logic cell 48, 50 or 52 (I$250, I$248, I$242, respectively)) is the input predictor of the output signal 38 from logic cell 44. Assume the predictor for logic cell 44 is the output signal from logic cell 50 (I$248). The file of input predictors and predictor transition times for the logic cell 50 (I$248) is thereafter accessed and used, along with the time delay of the logic cell 50, to identify the input predictor to the logic cell 50 and its transition time. In the example shown in FIG. 5, assume that the input predictor to logic cell 50 is the logic cell 54 (I$199). In the example shown in FIG. 5, the logic cone is thereby identified at 56, and the logic cone includes the logic cells 34, 44, 50 and 54. The logic cone 56 is four levels or stages of logic deep, with each stage or level being represented by different one of the cells 34, 44, 50 and 54.

In the derivation and definition of the logic cone 56 shown in FIG. 5, those logic cells which do not supply output predictors at the point in time of interest of the output signal are not automatically included in the logic cone. For example, logic cell 58 does not supply the input predictor signal to the logic cell 50, because logic cell 54 supplies the input predictor. Therefore logic cell 58 is not within the logic cone 60. Similarly, logic cell 46 does not supply the input predictor to the AND gate 54, so the logic cell 46 and the logic cells 60, 62 and 64 which supply input signals to the logic cell 46 are not included within the logic cone 56.

Thus, in the manner described and illustrated by the example in FIG. 5, the output signal transition from a selected logic cell is recognized as having been caused by an input predictor which transitioned at a known input predictor transition time. The identified input predictor to a logic cell and the transition time of that input predictor identifies the preceding logic cell in the preceding logic level which caused that input predictor, because the input predictor to the subsequent logic cell is the output signal from the preceding logic cell. With this information, the print and change and predictor files (table 42, FIG. 4) for the preceding logic cell is thereafter examined, and its input predictor and input predictor transition times are identified. Using the transition times and the delay times of each preceding logic cell allows the logic cone to be automatically identified and defined.

After the logic cone is defined at step 12, the schematic diagram of the logic cone is displayed at step 14, as shown in FIG. 1. Automatically displaying the logic cone at step 14 has the benefit of facilitating the analysis, because the analyst sees the entire critical path of logic cells which define the logic cone, without requiring the manual selection of relevant logic cells. Moreover, only the relevant portion of the overall schematic diagram is displayed as the logic cone at step 14, which also facilitates a more focused and rapid analysis of only the relevant circuitry.

Defining the logic cone automatically in this manner based on the input predictors is a considerable improvement because the task of identifying the preceding logic cells which predict the transition is done automatically, rather than manually. Previously, identifying the preceding logic cells manually required considerable mental effort and time to compare the various signals and thereby identify the one which actually caused the output transition. Because of the effort and time involved, the tedium of such manual identification frequently resulted in errors and greatly enhanced the risk of errors. Moreover, the effort involved greatly extended the time required for such analysis.

To further facilitate the analysis, the simulated waveforms for the relevant cells of the logic cone are also displayed at step 16, as shown in FIG. 1, preferably in conjunction with the display of the schematic diagram of the logic cone at step 14. Displaying only the relevant waveforms relative to be relevant logic cells of the logic cone facilitates a more focused and rapid analysis of the relevant circuitry.

The steps 14 and 16 (FIG. 1) of displaying the logic cone and simulated waveforms for the relevant logic cells of the logic cone is illustrated in more detail in FIG. 6 and in FIGS. 7A to 7N, respectively, using the schematic circuit diagram shown in FIG. 6 as another example. As shown in FIG. 6, a logic cone 70 at a particular time has been defined and displayed for examining the output signal Q of a flip-flop 72 (I$5). For illustrative purposes in FIG. 6, a clock signal (CK) from a string of series-connected inverters 74, 76, 78 and 80 (I$6, I$7, I$8, I$9, respectively) is also shown, but would normally not be displayed in conjunction with step 14 (FIG. 1) of displaying the logic cone. In addition to the flip-flop 72, the logic cone 70 includes an AND gate 82 (I$4), an inverter 84 (I$3), another AND gate 86 (I$2) and a buffer amplifier 88 (I$1).

The relevant logic cone 70 exists only as of a particular time at which the output signal Q from the flip-flop 72 is examined, and that time point is 1100 picoseconds as shown in FIG. 7A. The operation of the simulation tool (step 24, FIG. 1) recognizes the functionality of the flip-flop 72, and that the flip-flop 72 has a predetermined time delay before its output signal Q changes states. The Q output signal changes based on the D input signal, the clock signal (CK) and the reset signal (RESET), which are respectively shown in FIGS. 7B, 7C and 7D. Because the reset signal (FIG. 7D) is not relevant during normal operation of the circuit, after having first established the output signal of the flip-flop 72 in a predetermined initial state, the reset signal (FIG. 7D) is not the input predictor. Furthermore, the clock signal (FIG. 7C) is also not the input predictor at the 1100 picosecond time point, because the clock signal simply clocks the D input signal to cause a transition of the output signal Q from the flip-flop 72. Thus, the D input signal (FIG. 7B, I$5(D)) is the input predictor for the flip-flop 72. The clock signal (FIG. 7C) and the reset signal (FIG. 7D) may or may not be shown for understanding purposes in conjunction with the step 16 (FIG. 1).

The D input signal to the flip-flop 72 is the output signal (I$4(X), FIG. 7E) of the AND gate 82. The output signal of the AND gate 82 is predicted by the A input signal to the AND gate 82 as shown in FIG. 7E. The transition of the output signal (I$4(X), FIG. 7E) from the AND gate 82 occurs after a predetermined time delay from the transition of the A input signal (I$4(A), FIG. 7F) to the AND gate 82. The B input signal (I$4(B)) to the AND gate 82 is also shown in FIG. 7G, although it is not an input predictor and may or may not be shown for understanding purposes in conjunction with step 16 (FIG. 1).

The A input signal (I$4(A)) to the AND gate 82 is the output signal (I$3(X), FIG. 7H) of the inverter 84. The output signal (FIG. 7E) from the AND gate 82 occurs only after the predetermined time delay associated with the AND gate 82 after the transition of the A input signal (FIG. 7F) to the AND gate 82. The input predictor (I$3(A), FIG. 71) to the inverter 84 is the output signal I$2(X), FIG. 7J) from the AND gate 86. The transition of the output signal of the inverter 84 occurs after the predetermined time delay associated with the inverter 84, as shown by the time difference between the transitions of the signals shown in FIGS. 7H and 7I.

The input signal to the inverter 84 (I$3(A), FIG. 7I) is the output signal from the AND gate 86 (I$2(X), FIG. 7J). The B input signal (I$2(B), FIG. 7L) to the AND gate 86 is the input predictor of the output signal from the AND gate 86 (FIG. 7J). The A input signal (I$2(A), FIG. 7K) may be displayed for understanding purposes in the step 16 (FIG. 1), although this signal is not an output predictor.

The output signal from the buffer amplifier 88 (I$1(X), FIG. 7M) is predicted by the single input signal to the buffer amplifier 88 (I$1(A), FIG. 7N). The output signal from the buffer amplifier 88 (FIG. 7M) occurs a predetermined time delay after the transition of the input signal (FIG. 7N).

The waveform viewing tool is used to display the relevant waveforms for the relevant cells of the logic cone 70, as shown by FIGS. 7A to 7M, to accomplish the step 16 (FIG. 1). The analyst may optionally choose to display other waveforms at each stage or level of the logic cone 70 for purposes of completing an understanding of the input predictor signals at each logic cell of the logic cone.

The depth or number of logic levels or stages for which the relevant waveforms (FIG. 7A to 7N) is five as shown in FIG. 6. In other words, the number of logic levels or the depth of logic levels is that number of logic cells in the circuit schematic diagram which precedes the output signal in question. The depth or level of logic cells include the logic cell which supplies the output signal under analysis and the preceding number of logic cells which contribute to that output signal.

With the information displayed at steps 14 and 16, the analyst may perform the analysis at step 33 (FIG. 1), by focusing only on the relevant logic cells defined by the logic cone, and the waveforms of those relevant logic cells of the logic cone, not the entire circuitry and waveforms from the entire circuit or semiconductor integrated circuit. An understanding of those relevant logic cells is thereby greatly facilitated by displaying only the relevant logic cells of logic cone and their associated waveforms, selected in response to a selected output signal from a selected logic cell existing at any predetermined time. To perform the analysis at step 33, the information displayed at steps 14 and 16 is available for the analyst to refer to and study. To perform the analysis at step 33 to identify problems arising from the actual implementation of the circuitry in a semiconductor chip, actual signals from the relevant nodes of the specific logic cell implemented in the IC are obtained, and those signals are compared to the simulated waveforms obtained at step 16. A discrepancy between the simulated waveforms and the actual signals indicates a fault or anomaly which could thereafter be easily traced by using the logic cone displayed at step 14. The display of the relevant logic cells of the logic cone also facilitates locating the logic cells actually implemented in the IC.

By displaying only the relevant logic cone, the analyst need not separately analyze each logic level in a rearwardly sequential step-by-step manner. Instead, the analyst may jump to the beginning of the logic cone and immediately compare the signals at those locations to those which are predicted. If a discrepancy is noted at the beginning of the logic cone, all the time which would have otherwise have been spent in manually tracing logic cells and waveforms of the logic cone will have been saved. Of course, the decision as to the location for starting the analysis is subjective to the analyst, but may be based on suspicion or intuition of the analyst. The analysts insight into the circuit behavior is greatly facilitated by viewing the logic cone which is automatically derived by the basic methodology of the present invention and the simulated waveforms which are also automatically associated with that logic cone.

With the foundational description presented above, a more complete understanding of the detailed steps of the basic methodology of the present invention is described in conjunction with FIG. 8. The basic methodology of the present invention starts at step 100 and progresses to reading the print on change and predictor files which contain the identification of the logic cell, the output state change, the output transition time, the input predictor transition time and the input predictor (e.g., table 42, FIG. 4), as shown at step 102. In the flowcharts shown in FIGS. 8 and 9, the input predictor is abbreviated as "IP" and the input predictor transition time is abbreviated as "PTT." After reading the files at step 102, the circuit schematic and waveforms are displayed at step 104 in the conventional manner as has been previously described in connection with steps 28 and 30 (FIG. 1), using the simulation tool.

Once the schematic and the waveforms have been displayed at step 104, the analyst selects the logic cell at which the analysis is to commence, as shown at step 106 (also shown at step 32, FIG. 1). The time point at which the logic cone is to be defined is selected at step 108, preferably by clicking with a mouse on the transition edge of the displayed output waveform from the selected logic cell at the selected output transition time. Selecting this time point at step 108 of the output waveform becomes the reference time point for establishing the selected logic cone since the input predictors (IPs) and the input predictor transition times (PTTs) are all established with respect to this reference output transition time point.

Next, at step 110, the analyst selects the depth of the logic cone to be analyzed. As discussed previously in conjunction with FIGS. 5 and 6, the depth of the logic cone is the number of previous logic cells which influence the output signal from the selected logic cell and which are to be considered in defining the logic cone. After the depth of logic cone is set at step 110, the current depth for the analysis is set to one at step 112, as the starting point for the development of the logic cone from the selected logic cell.

At step 114, the predictor file of the input predictors (IP) and the input predictor transition times (PTTs) is searched. Thereafter at step 116, the input predictor (IP) and the input predictor transition time (PTT) are found as a result of searching the file at step 114. At step 118, a determination is made as to whether the input predictor is a top-level input to the logic cone. A top-level input would be the input stimulus to the circuit, which resulted in the output signal of interest from the selected logic cell. A top-level input would not be generated by the relevant logic cells of the logic cone. Thus, an affirmative determination at step 118 would result in the termination of the basic methodology of the present invention as shown at step 120. However, if the determination at step 118 is negative, indicating that the input predictor is part of the logic cone under consideration, the program flow progresses to step 122.

At step 122, a determination is made as to whether the input predictor is a synchronous signal. An input predictor which is a synchronous signal in a logic circuit will usually be a clock signal applied to a synchronous logic element, such as the flip-flop 72 described in FIG. 6. However, a synchronous signal could arise from other, somewhat unusual sources. In most cases, a reset signal will not be a synchronous signal, because the reset signal is usually the primary input predictor for the initial state of the entire circuit. As such, it is generally not necessary to trace and examine a logic cone associated with a reset signal.

In circumstances where the input predictor is a synchronous signal, it will be necessary to examine the path of the synchronous signal as a part of the logic cone. For example, both the data signal and a clock signal to a D-type flip-flop influence the Q output signal from that flip-flop. Under those circumstances it may be necessary or desirable to trace both of the logic cones associated with the data signal and the clock signal.

If the input predictor is a signal from a non-synchronous logic cell, such as a gate, the determination at step 122 is negative. Even if the input predictor is from a synchronous logic cell as determined by an affirmative determination at step 122, a further determination is made at step 123 as to whether the input predictor is a clock signal. If the determination at step 123 is negative, the input predictor is a data signal. In most cases when a synchronous logic cell is encountered in the logic cone, the primary signal of input prediction significance will be the data signal. Under such circumstances as identified by the determination at step 123, the data signal will be handled in a manner similar to a negative determination at step 122, indicating that the input predictor is from a non-synchronous logic cell. Thus, negative determinations at steps 122 and 123 will advance the program flow to step 124.

At step 124, the input predictor (IP) and the input predictor transition time (PTT) which were found at step 116 are used with the schematic viewing tool and the waveform viewing tool to cause those tools to display the logic cone to the current depth as shown at step 126. In other words, at steps 124 and 126, the schematic viewing tool and the waveform viewing tool have begun to develop the logic cone. The logic cone is developed only to the extent of the current depth, with the current depth initially being set at step 112 and subsequently being incremented at step 130, as described below. Iterations of the process will occur, as is discussed below, until the entire logic cone is developed and displayed to the extent of the desired depth selected at step 110.

If the displayed current depth of the logic cone results in displaying the start or beginning point of the circuit, as determined at step 128, no further logic cell circuit elements are included in the logic cone and the program flow terminates at step 120. However, if the determination at step 128 is negative, indicating that there is further depth to the logic cone, the current depth of the logic cone is incremented at step 130. Thereafter at step 132, a determination is made at step 132 as to whether the current depth is equal to the depth selected at step 110. If the determination at step 132 is affirmative, the depth of the logic cone displayed at step 126 is equal to that selected by the analyst at step 110, and therefore the program flow should terminate at step 120. However, if the determination at step 132 is negative, indicating that further depths of the logic cone must be developed and presented, the program flow returns to step 114.

The return of the program flow to step 114 from step 132 causes the program flow to iterate again through steps 114, 116, 118, 122, 123, 124, 126, 128, 130, 132 and 120 in the same manner as has been previously described, until an input stimulus is identified as the input predictor as determined at step 118, or until the beginning or starting point of the logic cone is reached as determined at step 128, or until the selected depth of the logic cone is reached as determined at step 132.

In those cases of an input predictor arising from a synchronous logic cell as determined at step 122 and when that input predictor is a clock signal as determined at step 123, logic sub-cones must be created within the primary logic cone to examine the synchronous waveforms, as a part of the primary logic cone. Logic sub-cone is maybe thought of as branches from the primary logic cone, and will be displayed in conjunction with the primary logic cone and its simulated waveforms. Step 134 generally describes the creation of each sub-cone for each clock input predictor. Step 134 will be described below in connection with FIG. 9. It may also be possible that multiple sub-cones exist for each primary logic cone. This circumstance would occur when multiple synchronous elements are encountered in the primary logic cone.

An example of a logic sub-cone is illustrated in FIG. 6. The synchronous clock signal (CK) is generated from the series connected inverters 74, 76, 78 and 80. These inverters and the signals from them constitute a sub-cone if the clock signal is the input predictor to be output signal from the flip-flop 72.

Referring back to FIG. 8, at step 136, a determination is made of whether all of the logic sub-cones and their simulated waveforms have been created within the primary logic cone for the selected depth of the primary logic cone as set at step 112 and determined at step 132. If not, the program flow reverts back to step 134, until all of the sub-cones for that particular depth of the primary logic cone have been created. Once all of the sub-cones for the particular depth of logic within the primary logic cone have been created, as determined at step 136 by an affirmative determination, the program flow reverts to back to step 124 where the input predictors and the input predictor transition times associated with each sub-cone are used by the schematic viewing and waveform viewing tools at step 124 so that the sub-cones are displayed at step 126 in the manner previously described. In this manner, the sub-cone generated by the clock input predictors will be added to the primary logic cone for consideration in the same manner as the non-synchronous input predictors will be added and displayed.

The step 134 of creating sub-cones for each clock input predictor is shown in more detail in FIG. 9. Many of the steps of the flowchart shown in FIG. 9 are similar to those previously described in FIG. 8, but are repeated as necessary to create each logic sub-cone as determined at step 134 (FIG. 8). The first step 140 shown in FIG. 9 is entered from either steps 122, 123 or 136 (FIG. 8). At step 140, the depth of the logic sub-cone to be analyzed is set. The depth of the logic sub-cone may be greater than or less than the depth of the parent logic cone under analysis, at the discretion of the analyst. At step 142, the current depth of the logic sub-cone is set to the current depth of the parent logic cone. Setting the current depth of the logic sub-cone at step 142 to the current depth of the parent logic cone assures that the logic sub-cone will commence at a coordinated, location to the parent cone. At step 144, the file of the output state changes, the output transition times, the input predictor transition times (PTTs) and the input predictors (IP) for the logic cell in question are accessed, and the applicable input predictor (IP) and the applicable input predictor transition time (PTT) is found at step 146.

Next, at step 148 a determination is made as to whether the input predictor (IP) found at step 146 is a top level input to the circuit. If so, a program flow shown in FIG. 9 reverts back to step 124 (FIG. 8). If the determination at step 148 is negative, a further determination is made at step 150 as to whether the input predictor (IP) came from a synchronous logic cell. If not, the program flow reverts to step 124 (FIG. 8). If the determination at step 150 is affirmative, a further determination is made at step 152 as to whether the input predictor (IP) is a clock signal. If not, the program flow returns to step 124. If the determination at step 152 is affirmative, a further synchronous logic cell within the sub-logic cell has been identified. Therefore, it will be necessary to create a sub-cone within the sub-cone for each clock input predictor as shown at step 154.

The step 154 is essentially accomplished by an iteration of all of the steps shown in FIG. 8, for the sub-cone within the sub-cone. Because of the similarity to the steps described in FIG. 8, it is unnecessary to further describe the step 154 with respect to each sub-cone within a sub-cone. At step 156, after one sub-cone within the sub-cone has been created, the program flow progresses from step 156 to step 154 until all of the sub-cones within the sub-cone have been created.

Once an affirmative determination occurs at step 156, the current depth of the sub-cone is checked at step 158 to determine whether it is equal to the depth selected at step 140. Until the current sub-cone depth is equal to the selected depth as established by negative determination at step 158, the program flow moves to step 160 where the current depth of the sub-cone is incremented. Thereafter the program flow reverts back to step 144, where the series of steps previously described is again incremented until the sub-cone depth reaches the selected depth as determined affirmatively at step 158. Thereafter, the program flow reverts to step 124 (FIG. 8).

Step 146 shown in FIG. 9 results in finding the input predictor (IP) and the input predictor transition time (PTT) for each logic cell in each sub-cone, and each logic cell of each sub-cone within a sub-cone. Thus, when the transition to step 124 (FIG. 8) occurs from FIG. 9, the input predictors and input predictor transition times are available to be used by the schematic viewing and waveform viewing tools as shown at step 124 in FIG. 8. Thereafter at step 126 shown in FIG. 8, all of the sub-cones and the sub- cones within sub-cones will be displayed, for that given level of logic of the primary cone. It is in this manner that the steps 12, 14 and 16 are accomplished in the basic program illustrated in FIG. 1.

As is apparent from the detailed description of the basic methodology of the present invention (also described in Ser. No. 09/597,433), the analysis of complex logic circuits is greatly facilitated. Conventional simulation, schematic viewing and waveform viewing tools are used to provide information and convenience to the circuit analyst which is not believed to have been available before the development of this basic methodology. Specifically, this basic methodology allows the analyst to choose a logic cell and a point in time of an output signal from that selected logic cell and analyze only the relevant portions of the more complex circuit which predict that output signal at the selected time. The analysis is facilitated by displaying only the relevant portion of the circuit in the form of the logic cells defining the logic cone, and any relevant logic sub-cones within the primary logic cone, as well as the waveform simulations associated with the logic cells of the relevant logic cone. The analyst can quickly evaluate this information to establish an understanding of the functionality of the circuit or to identify the cause of a defect within the circuit. By not having to manually trace through an entire complex circuit, and to make mental determinations based on simulations at each manually traced point, a large amount of time is saved and the analyst is spared from the tedium and risk of error in a having to manually determine each point and each waveform for analysis at a relatively large number of nodes within a complex circuit.

The present invention builds on these improvements by allowing the analyst to evaluate the design of the circuit with respect to timing margin and signal skew under conditions where the possibility of an error or malfunction is more likely to occur, even though the typical simulation may not reveal any malfunction or error. The methodology of the present invention involves performing the basic cone analysis method previously described in conjunction with FIGS. 1–9 under best case and worst case scenarios, obtaining timing margin and/or signal skew information under those scenarios, and evaluating the circuit design based on that timing margin and/or signal skew information.

More details of the present invention are explained by reference to FIG. 10. The method of deriving timing margin and signal skew information is shown by the process flow referenced at 170. The methodology 170 begins at step 172, where the analyst selects the variables considered as presenting the best case for performance of the IC circuit. The step 172 involves choosing the magnitude of the temperature, voltage and process variables which are used by the simulation program in performing the basic cone analysis methodology shown at step 174. In some circumstances, the suppliers of the simulation program may suggest or actually choose the values for the best case variables. However in other cases, the analyst may actually select the magnitudes of those variables. Of course, if there are other variables to choose beyond temperature, voltage and process, those additional or different variables and their magnitudes are also selected at step 172.

The basic cone analysis methodology which is performed at step 174 is that basic methodology which has been described above in conjunction with FIGS. 1–9. As a result of performing the basic cone analysis methodology at step 174, a predictor file which contains the input predictor transition times and the input predictor signals for each logic cell of the cone is obtained. The predictor file and the input predictor transition times and input predictor signals have been described above in conjunction with FIG. 4. The predictor file information is recorded in memory at step 176, and that file is designated as representing the best case analysis.

At step 178, the analyst chooses those variables which are regarded as presenting the worst case performance of the circuit of the IC. The selection process shown at step 178 proceeds in a manner similar to the selection which occurred at step 172, except that the magnitude of the selected variables is different. It may be possible that some of the variables selected for the best or worst case scenario at one of the steps 172 or 178 may be different than the variables selected to represent the other scenario.

Another entirely separate cone analysis is performed at step 180, using the basic cone analysis methodology previously described in conjunction with FIGS. 1–9. The predictor file of information derived for each logic cell by performing the basic cone analysis at step 180 is recorded in memory at step 182, and is designated as representing the worst case scenario.

After completing step 182, the process flow 170 has generated and recorded predictor files at steps 176 and 182. These predictor files contain the input predictor transition times and the input predictor signals for both the anticipated best case and worst case of performance of logic cone. The best and worst case information is thereafter used at step 184 to derive the timing margin and/or signal skew for the cells of the logic cone. The timing margin information and/or the signal skew information is thereafter displayed at step 186. The display of the timing margin and/or signal skew information at step 186 is thereafter analyzed by the circuit analyst to evaluate the functionality and robustness of the design of the IC circuitry which forms a part of the logic cones derived at steps 174 and 180. The details of step 184 of using the predictor file to derive the timing margin and signal skew information are more completely described in conjunction with FIGS. 11 and 12, respectively.

Details of the step 184 (FIG. 10) for deriving timing margin information are shown by the process flow 184' shown in FIG. 11. The timing margin information relates to the setup and hold times, and the setup and hold times are applicable to each synchronous cell of the logic cone. Each synchronous cell may have a sub-cone associated with it, as has been described above in conjunction with FIGS. 8 and 9. The sub-cone information, as well as the basic cone information, are used to evaluate the data and clock signals for each synchronous cell.

The process flow 184' begins at step 188, where all the synchronous logic cells of the IC circuit are identified. Step 188 is performed with reference to the netlist used in performing the basic cone analysis and simulation methodology. The netlist identifies those cells of the logic cone which are synchronous cells.

Next at step 190, after each synchronous cell has been identified at step 188, the input predictors and the input predictor transition times are read from the best case predictor file for each synchronous cell of the basic cone and for each sub-cone of associated with each synchronous cell. The input predictors to each synchronous cell are the clock and data signals.

The timing margin between the clock and data signals is thereafter determined at step 192, by determining the time difference between the input predictor transition times for the data and clock signals. The input predictor transition times for the data signals and for the clock signals represent the times when each of those signals are asserted. The difference between the assertion times of those signals is the timing margin. The timing margin information obtained at step 192 applies to the best case scenario.

Next, as shown at step 194, the timing margins derived for the best case scenario are displayed in conjunction with each synchronous logic cell of the logic cone. Preferably the timing margins are displayed in conjunction with the schematic diagram of the logic cone and the waveform diagrams of the clock and data signals. Displaying the timing margins in this manner allows the analyst to quickly recognize any set up and hold time violations, as well as recognizing those situations involving tight timing margins. A tight timing margin is a situation where the set up and hold time violation does not occur but where the timing is close to a set up and hold time violation. By viewing the displayed timing margin information, the circuit analyst is able to understand the behavior of the synchronous cells of the logic cone where functionality is either defective or marginal. The necessity to make changes in the design of the IC circuit to avoid setup and hold time violations and timing marginality in set up and hold time performance is suggested by the timing margin information displayed at step 194.

Next, as shown at step 196, the input predictor transition times and the input predictors are read from the worst case predictor file for each synchronous cell of the cone and sub-cone associated with each synchronous cell. Again, the input predictors to each synchronous cell will be the clock and data signals. The timing margin between the clock and data signals is thereafter determined at step 198 by determining the time difference between the input predictor transition times for the data and clock signals. This difference represents the timing margin for the worst case scenario. As shown at step 200, the worst case timing margins for each synchronous cell of the IC are displayed. Again, the analyst can readily recognize any set up and hold time violations from the information displayed at step 200. The analyst also has the opportunity to evaluate the marginality of the setup and hold times, by recognizing those synchronous cells where the setup and hold times are close to a violation. With this information, the analyst has the ability to make changes in the circuit design to accommodate the worst case performance.

Although the best and worst case timing margins are shown in FIG. 11 as displayed in separate steps 194 and 200, it may also be useful to display the best and worst case timing margins for each synchronous cell of the circuit simultaneously in a single presentation, preferably in conjunction with the display of the schematic diagram of the logic cone. To accomplish such a simultaneous display, the information for the displays at steps 194 and 200 is presented simultaneously after performing the sequence of steps 188, 190, 192, 196 and 198.

It is also possible to display the signal skew or change between the best and worst case timing margins. Displaying the skew in the timing margins involves steps similar to those of the detailed process flow 184" shown in FIG. 12. The process flow 184" elaborates the step 184 (FIG. 10) in a more detailed manner. In most cases, however, the process flow 184" shown in FIG. 12 is used to evaluate the skew or change in the input predictor signals at each of the logic cells of the logic cone.

The process flow 184" begins at step 202 where the best case predictor file for each cell of the logic cone is read. Next at step 204, the worst case predictor file for each cell of the logic cone is read. The two predictor files read at steps 202 and 204 contain a listing of those input predictor signals which are relevant to the logic cone, and the transition times of those input predictors. At step 206, the best case and worst case input predictor transition times for each input predictor of each cell of the logic cone are subtracted to determine the difference between those input predictor transition times. The difference between the best case and worst case input predictor transition times is the signal skew. In other words, the signal skew is the difference in time at which the input predictors are asserted for each cell of the logic cone under best and worst case conditions.

The signal skew for each input predictor is thereafter displayed at step 208. Preferably the display of the signal skew is presented in conjunction with the schematic diagram of the cells of the logic cone. This simultaneous presentation facilitates a clearer recognition of the signal skew throughout the elements of the logic cone. Based on the signal skew information displayed at step 208, the circuit analyst is able to obtain an immediate understanding of the amount of signal movement between best and worst case situations.

There is a possibility, when performing the cone analysis at steps 174 and 180 as shown in FIG. 10, that the logic cones derived for the best case scenario and the worst case scenario will be different. Different logic cones may result from the fact that the magnitudes of the variables selected for the best case and worst case scenarios are so sufficiently different that the timing of the input predictor signals changes enough to change the logic cone to include and exclude different cells. The fact that two different logic cones are created will itself be recognized as a problem of timing margin or signal skew. In such a case, the analyst recognizes that the circuit will require modification. The second above identified invention (U.S. patent application Ser. No. 09/684,770) describes a method which advantageous use of generating multiple different logic cones.

Most IC failures result from tight timing margins and/or large signal skews under unexpected or fringe operating conditions of the circuit. In many cases such unexpected or fringe operating conditions have not been adequately simulated during the design of the IC. The present invention permits the circuit analyst to obtain complete information concerning the performance of the IC under the best and worst case scenarios. Moreover, by varying the permutations of the selected magnitudes of the best and worst case variables, the critical timing path defined by the logic cone can be evaluated under a variety of different circumstances. These differing evaluations will confirm the assumptions concerning the best case and the worst case scenarios, in which case the analyst has a greater degree of assurance that the actual best and worst case scenarios for the circuit have been considered. On the other hand, if by varying the permutations of the magnitudes of the selected input variables, it is determined that certain permutations create greater timing margins or larger signal skews, the assumptions concerning the best and worst case scenarios may be adjusted and the entire circuit thereafter re-evaluated under those adjusted best and worst case assumptions. The present invention also allows the analyst to evaluate the internal workings of the cells of the logic cone under circumstances which do not necessarily cause a malfunction or error. The ability to make such an internal evaluation under proper working conditions will readily point out marginal circumstances where an error or malfunction could readily occur, thereby emphasizing the possibility of making precautionary design changes to avoid future failures. Many other advantages and improvements will be apparent from a complete understanding of the present invention.

A preferred embodiment of the present invention and many of its improvements have been described with a degree of particularity. This description is of a preferred example of implementing the invention, and is not necessarily intended to limit the scope of the invention. The scope of the invention is defined by the following claims.

What is claimed is:

1. A method of deriving one of timing margin or signal skew information from relevant ones of a plurality of connected logic cells and waveforms from the relevant logic cells of a circuit described by using a simulation tool, the waveforms including input and output waveforms to and from each logic cell, the simulation tool describing a transition and a transition time point when the transition occurs for each waveform, said method comprising the steps of:

selecting an output waveform and a transition time point of the selected output waveform delivered from a selected logic cell;

identifying a predictive input waveform and a transition time of the predictive input waveform to the selected logic cell which causes the transition of the output signal from the selected logic cell at the selected transition time;

identifying a predictive logic cell connected to the selected logic cell which supplies the output waveform to the selected logic cell which constitutes the predictive input waveform identified in the preceding step;

performing the aforesaid three steps as a repetition;

performing at least one new repetition to accomplish the selecting and identifying steps under circumstances where the predictive logic cell identified in a previous repetition becomes the selected logic cell for the new repetition and the transition time point of the predictive input waveform to the selected logic cell of the previous repetition becomes the selected transition time of the output waveform of the selected logic cell for the new repetition;

defining a logic cone formed from each of the logic cells selected and identified by performing the repetitions;

selecting magnitudes for variables influencing performance of the circuit under best case circumstances and worst case circumstances;

using the best case variable magnitudes when defining a first instance of the logic cone;

using the worst case variable magnitudes when defining a second instance of the logic cone; and deriving the one of timing margin or signal skew information from any difference in transition times of the predictive input waveforms in the first and second instances of the defined logic cone.

2. A method as defined in claim 1, further comprising the steps of:

displaying a schematic diagram of the selected and predictive logic cells identified from all of the repetitions which define the logic cone; and displaying the one of timing margin or signal skew information for at least some of the logic cells of the logic cone.

3. A method as defined in claim 2, further comprising the steps of:

displaying a schematic diagram of the identified selected and predictive logic cells by using a conventional schematic viewing tool;

displaying the identified input and output waveforms by using a conventional waveform viewing tool; and displaying the one of the timing margin or signal skew information in conjunction with each logic cell and the identified input and output waveforms of each logic cell of the logic cone.

4. A method as defined in claim 2, further comprising the steps of:

deriving the timing margin information of a synchronous cell which has a predictive data input waveform and a predictive clock input waveform in one of the first or second instances of the defined logic cone, by determining the transition time of a selected predictive data input waveform to the synchronous cell in the one instance of the defined logic cone, determining the transition time of the selected predictive clock input waveform to the synchronous cell in the one instance of the defined logic cone, and determining the timing margin information for the synchronous cell from the difference in the transition times of the selected predictive data and clock input waveforms in the one instance of the defined logic cone.

5. A method as defined in claim 4, further comprising the steps of:

deriving the timing margin information of the synchronous cell in the other of the first or second instances of the defined logic cone, by determining the transition time of the selected predictive data input waveform to the synchronous cell in the other instance of the defined logic cone, determining the transition time of the selected predictive clock input waveform to the synchronous cell in the other instance of the defined logic cone, and determining the timing margin information for the synchronous cell from the difference in the transition times of the selected predictive data and clock input waveforms in the other instance of the defined logic cone.

6. A method as defined in claim 5, further comprising the steps of:

determining the skew in the timing margin information of the synchronous cell from the first and second instances of the logic cell, by determining the difference in the transition times of the selected predictive data waveforms in the first and second instances of the defined logic cone.

7. A method as defined in claim 4, further comprising the step of:

identifying the predictive input waveform as a synchronous waveform.

8. A method as defined in claim 4, further comprising the step of:

identifying the predictive input waveform as a clock waveform.

9. A method as defined in claim 4, further comprising the steps of:

defining the logic cone of connected predictive and selected logic cells by performing the repetitions; and including within a sub-part of the cone, at least one predictive and selected synchronous logic cell.

10. A method as defined in claim 9, further comprising the step of:

performing the repetitions to define the sub-part of the cone.

11. A method as defined in claim 10, further comprising the step of:

selecting the number of repetitions to define the sub-part of the cone.

12. A method as defined in claim 10, further comprising the step of:

performing the repetitions until the predictive input waveform is identified as a stimulus input waveform applied to a logic cell of the defined sub-part of the cone.

13. A method as defined in claim 2, further comprising the steps of:

deriving the signal skew information of a selected logic cell from the first and second instances of the defined logic cone, by determining the transition time of a selected predictive input waveform to the selected cell in the first instance of the defined logic cone, determining the transition time of the selected predictive input waveform to the selected cell in the second instance of the defined logic cone, and determining the signal skew information for the selected cell from the difference in the transition times of the selected predictive input waveforms in the first and second instances of the defined logic cone.

14. A method as defined in claim 2, further comprising the steps of:

creating netlist information describing the logic cells of the circuit by using the simulation tool; and creating information describing output waveforms from the logic cells described by the netlist by using the simulation tool and by information describing each transition and each transition time for the input and output waveforms to and from each logic cell.

15. A method as defined in claim 2, further comprising the steps of:

associating variable performance information with each predictive and selected logic cell of the circuit, the variable performance information describing a functional characteristic which influences an occurrence of the predictive input waveform and the transition time of the output waveform for each logic cell;

deriving the predictive input waveform and the transition time of the predictive input waveform by using the variable performance information;

using the variable performance information as the variables selected for defining the first and second instances of the logic cone; and selecting different variable performance information for the best case and the worst case when defining the first and second instances of the logic cone.

16. A method as defined in claim 15, further comprising the step of:

creating one file and another file of the information for each logic cell of the circuit in the first and second instances of the defined logic cone respectively, the information of each file including information which describes a state of the output waveform at each output waveform transition, the time of each output waveform transition, the predictive input waveform, and the transition time of the predictive input waveform which results in the output waveform transition.

17. A method as defined in claim 16, further comprising the steps of:

referring to the one file of information for each logic cell to perform each repetition when defining the first instance of the logic cone; and referring to the other file of information for each logic cell to perform each repetition when defining the second instance of the logic cone.

18. A method as defined in claim 15, wherein the variable performance information relates to temperature of the circuit.

19. A method as defined in claim 15, wherein the variable performance information relates to the magnitude of voltage applied to the circuit.

20. A method as defined in claim 15, wherein the variable performance information relates to a semiconductor fabrication process used to manufacture the circuit.

21. A method as defined in claim 15, wherein the variable performance information describes a time delay associated with each logic cell of the circuit.

22. A method as defined in claim 15, wherein the variable performance information describes a time delay associated with interconnect conductors extending between logic cells of the circuit.

* * * * *